United States Patent
Koyama et al.

(10) Patent No.: US 6,479,877 B2
(45) Date of Patent: Nov. 12, 2002

(54) SEMICONDUCTOR DEVICE FOR LOAD DRIVE CIRCUIT

(75) Inventors: Yoshiki Koyama, Okazaki (JP); Nobumesa Ueda, Nagoya (JP); Hiroshi Fujimoto, Nagoya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/836,473

(22) Filed: Apr. 18, 2001

(65) Prior Publication Data

US 2001/0032990 A1 Oct. 25, 2001

(30) Foreign Application Priority Data

Apr. 19, 2000 (JP) .......................... 2000-118319

(51) Int. Cl.[7] .............................................. H01L 29/78
(52) U.S. Cl. ....................................... 257/401; 257/341
(58) Field of Search .................... 257/335, 341, 257/342, 343, 401, 327, 328, 329, 369, 368

(56) References Cited

U.S. PATENT DOCUMENTS

| | | |
|---|---|---|
| 4,636,825 A | 1/1987 | Baynes |
| 5,408,141 A * | 4/1995 | Devore et al. |
| 5,412,239 A | 5/1995 | Williams |
| 5,530,277 A * | 6/1996 | Otsuki et al. |
| 5,672,894 A | 9/1997 | Maeda et al. |
| 5,780,904 A * | 7/1998 | Konishi et al. |
| 5,999,041 A | 12/1999 | Nagata et al. |
| 6,011,413 A | 1/2000 | Hayakawa et al. |

FOREIGN PATENT DOCUMENTS

JP          10-256541          9/1998

OTHER PUBLICATIONS

US 6,104,076, 8/2000, Nakayama et al. (withdrawn)
Wolf, "Silicon Processing for the VLSI Era, vol. 2–Process Integration," 1990, Lattice Press, vol. 2, pp. 66–67.*

* cited by examiner

Primary Examiner—Nathan J. Flynn
Assistant Examiner—Kevin Quinto
(74) Attorney, Agent, or Firm—Law Offices of David G. Posz

(57) ABSTRACT

A semiconductor device for a load drive circuit includes a main LDMOS device and a sense LDMOS device that are connected to each other in parallel to form a current mirror circuit. The main LDMOS device and the sense LDMOS device have plural drain cells and plural source cells that are arranged to form a generally square shape as a whole. In the plural drain cells, drain cells of the sense LDMOS device are arranged along a diagonal of the generally square shape.

20 Claims, 3 Drawing Sheets

SEMICONDUCTOR DEVICE FOR LOAD DRIVE CIRCUIT

CROSS REFERENCE TO RELATED APPLICATION

This application is based upon and claims the benefit of Japanese Patent Application No. 2000-118319 filed on Apr. 19, 2000, the contents of which are incorporated herein by reference

BACKGROUND OF THE INVENTION

1. Field of the Invention

This invention relates a semiconductor device composed of a lateral type MOS transistor (hereinafter referred to as a main Tr) for supplying load current to a load, and a lateral type MOS transistor (hereinafter referred to as a sense Tr) connected to the main Tr in parallel for detecting current.

2. Description of the Related Art

JP-A-10-256541 discloses a load drive circuit in which a sense Tr and a main Tr for supplying load current to a load are connected to each other in parallel and constitute a current mirror circuit. Further, a voltage applied to a gate of the main Tr is controlled based on current flowing in the sense Tr and detected by a current detection resistor (sense resistor), so that a supply amount of the load current is controlled.

Referring to FIG. 5A, in case where each of a main Tr 101 and a sense Tr 102 is composed of lateral type MOS transistors (LDMOS device), drain cells 101*a*, 102*a* and source cells 101*b*, 102*b* of the main Tr 101 and the sense Tr 102 are arranged in a mesh shape (lattice arrangement) on an identical substrate. Further, as shown in FIG. 5B, the main Tr 101 and the sense Tr 102 respectively have source wiring members 103 for connecting the source cells 101*b*, 102*b* and drain wiring members 104 for connecting the drain cells 101*a*, 102*a*. Each of the source wiring members 103 and the drain wiring members 104 is formed into a comb shape so as to prevent short circuit from occurring among the source cells 101*b*, 102*b*, and the drain cells 101*a*, 102*a*.

When currents are applied to the LDMOS devices, however, there arises a difference in calorific value or heat release between the main Tr and the sense Tr, and temperature distribution occurs on the chip surface where the LDMOS devices are formed. Also when the chip is packaged, because stress derived from a package varies with positions, the stresses imparted to the main Tr and the sense Tr vary and become different from each other. This results in variations in ON resistance of the main Tr and the sense Tr and a shifted current mirror ratio. In consequence, the above-described load drive circuit cannot control the current accurately.

Especially when the main Tr 101 and the sense Tr 102 are formed on an SOI substrate, the main Tr 101 and the sense Tr 102 are formed at respective regions that are isolated from each other by a trench. In this case, problems caused due to thermal effects become prominent.

SUMMARY OF THE INVENTION

The present invention has been made in view of the above problems. An object of the present invention is to provide a semiconductor device capable of performing a current control by a load drive circuit at a high accuracy.

According to the present invention, a semiconductor device has a main MOS transistor formed on a substrate for supplying a current to a load, and a sense MOS transistor connected to the main MOS transistor in parallel to form a current mirror circuit with the main MOS transistor for controlling the current supplied to the load. Each of the main MOS transistor and the sense MOS transistor is composed of a lateral type MOS transistor and forms a current path in a direction parallel to a surface of the substrate. The sense MOS transistor is incorporated in the main MOS transistor and forms a polygonal shape on the surface of the substrate in cooperation with the main MOS transistor. Further, the sense MOS transistor extends to pass through a corner and a center of the polygonal shape.

According to the semiconductor device as described above, variations in ON resistance of the main MOS transistor and the sense MOS transistor can be prevented, and a shift of a current mirror ratio can also be prevented. In consequence, the current that is to be supplied to the load can be controlled accurately.

BRIEF DESCRIPTION OF THE DRAWINGS

Other objects and features of the present invention will become more readily apparent from a better understanding of the preferred embodiments described below with reference to the following drawings, in which.

DETAILED DESCRIPTION OF THE PREFERRED EMBODIMENT

Figure 1:
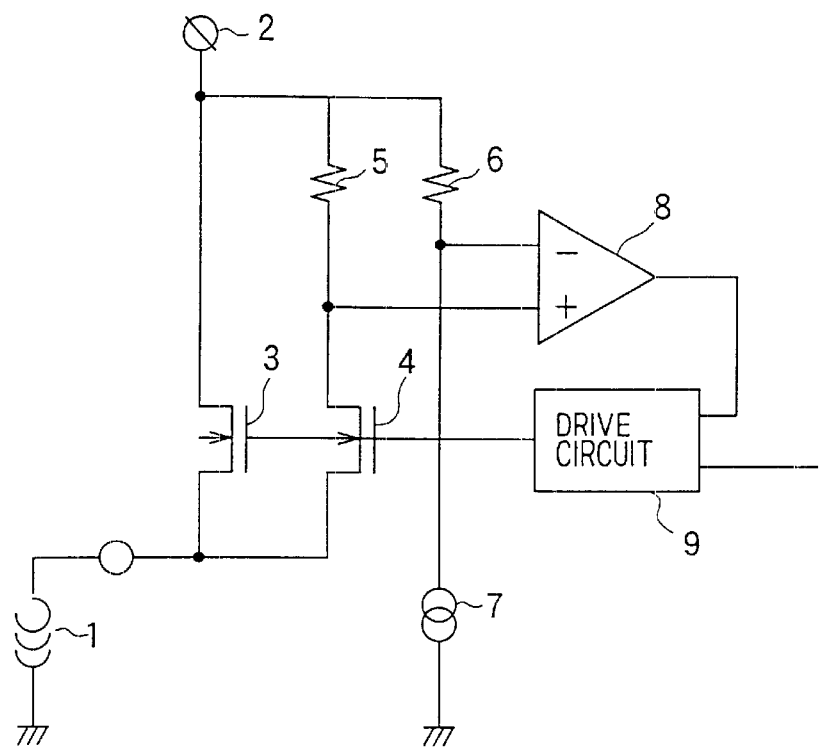
FIG. 1 is a diagram showing a circuit constitution of a load drive circuit used for a semiconductor device according to a preferred embodiment of the invention.

In a load drive circuit utilizing a semiconductor device 200 according to a preferred embodiment of the present invention, as shown in FIG. 1, a constant voltage source (power source) 2 is provided to supply load current to a load 1. A main Tr (main LDMOS device) 3 composed of an n-channel type LDMOS device is connected between the load 1 and the constant voltage source 2, and controls the load current that is to be supplied to the load 1. A sense Tr (sense LDMOS device) 4 composed of an n-channel type LDMOS device for detecting current is connected to the main LDMOS device 3 in parallel together with a sensor resistor 5.

The main LDMOS device 3 and the sense LDMOS device 4 are connected to each other non only at respective gate electrodes but at respective source electrodes, thereby forming a current mirror circuit. Accordingly, a part of the load current flows into the sense LDMOS device 4 in accordance with a predetermined current mirror ratio, and a sense voltage is outputted from a junction point between the sense resistor 5 and the sense LDMOS device 4 in accordance with the current flowing in the sense LDMOS device 4.

A detection reference resistor 6 and a constant current circuit 7 are connected to the constant voltage source 2. An electric potential at the junction point between the sense resistor 5 and the sense LDMOS device 4 is compared with an electrical potential at a junction point between the detection reference resistor 6 and the constant current circuit 7. Then, an output signal of a comparator 8 is inputted into a gate drive circuit (control circuit) 9. The gate drive circuit 9 controls voltages applied to the gate electrodes of the main LDMOS device 3 and the sense LDMOS device 4 based on the output signal to thereby control the load current.

Figure 2:
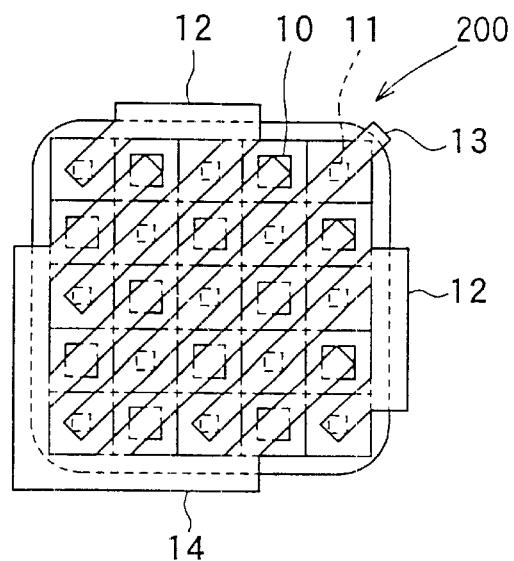
FIG. 2 is a plan view showing the semiconductor device.

FIG. 2 shows a plan view of the semiconductor device 200 that includes the main LDMOS device 3 and the sense LDMOS device 4 constituting this load drive circuit.

In the semiconductor device shown in FIG. 2, source cells 10 and drain cells 11 of plural LDMOS transistors are arranged alternately in a vertical direction and lateral direction in the figure and form a mesh shape (lattice shape), a contour of which is a generally square as a whole. The main LDMOS device 3 and the sense LDMOS device 4 are composed of the plural LDMOS transistors. A drain wiring member 12 for the main LDMOS device 3, a drain wiring member 13 for the sense LDMOS device 4, and a common source wiring member 14 for both the main LDMOS device 3 and the sense LDMOS device 4 are provided above the source cells 10 and the drain cells 11.

Figure 3:
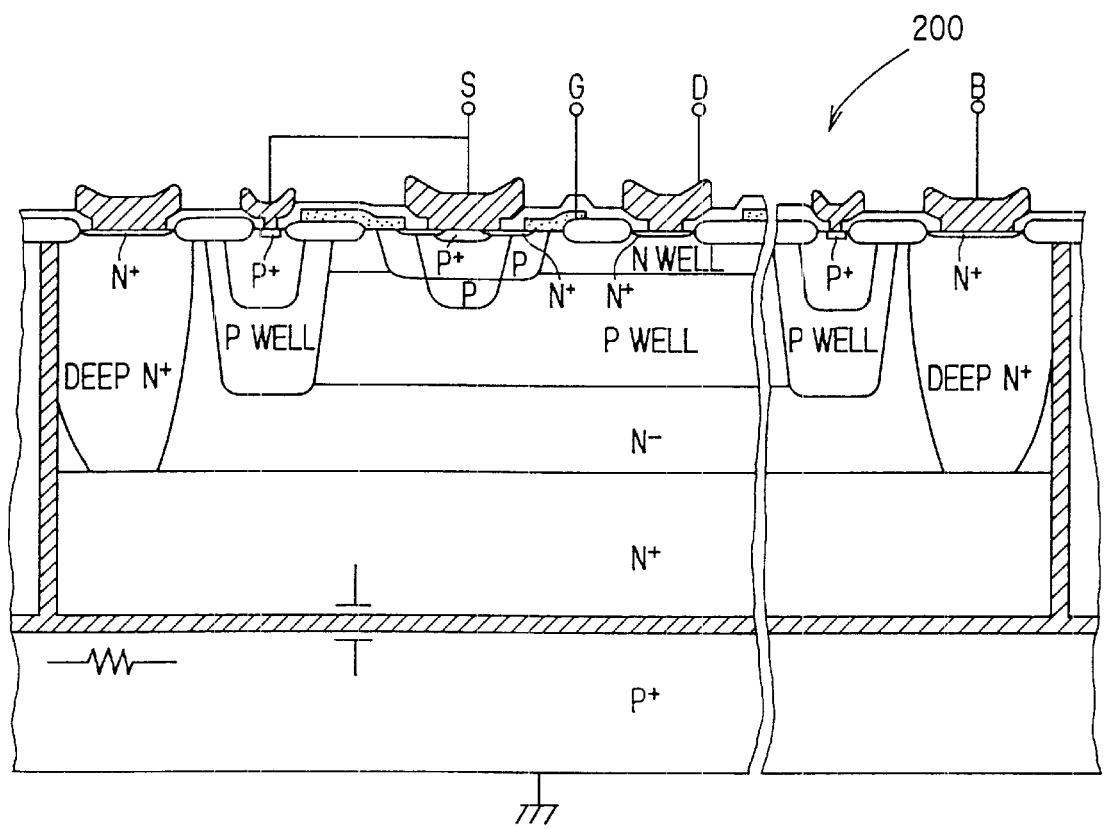
FIG. 3 is a cross-sectional view showing an LDMOS transistor in the semiconductor device.

The wiring members 12, 13, 14 are made of, for example, aluminum, and can be formed by a method explained in U.S. Pat. No. 5,672,894 filed on Oct. 19, 1995, hereby incorporated by reference. Further, the semiconductor device 200 in the present embodiment is preferably formed in an SOI substrate, and each LDMOS transistor has, for example, a structure as shown in FIG. 3 that is specifically explained in U.S. Pat. No. 6,104,076, referring to FIG. 8 of that patent, filed on Nov. 15, 1996, hereby incorporated by reference.

In the present embodiment, the drain wiring member 12 and the source wiring member 14 for the main LDMOS device 3 respectively have a comb-shape structure composed of a base part and several belt parts extending from the base part to connect the drain cells 11 of the main LDMOS device 3 or the source cells 10. The drain wiring member 13 for the sense LDMOS device 4 extends in an oblique direction from one corner of the generally square shape formed by the plural LDMOS transistors arranged so as to electrically connect the drain cells 11 of the sense LDMOS device 4. That is, the drain wiring member 13 extends approximately on a diagonal of the square shape composed of the plural LDMOS transistors to pass through the corner and the center of the square shape.

Figure 5A:
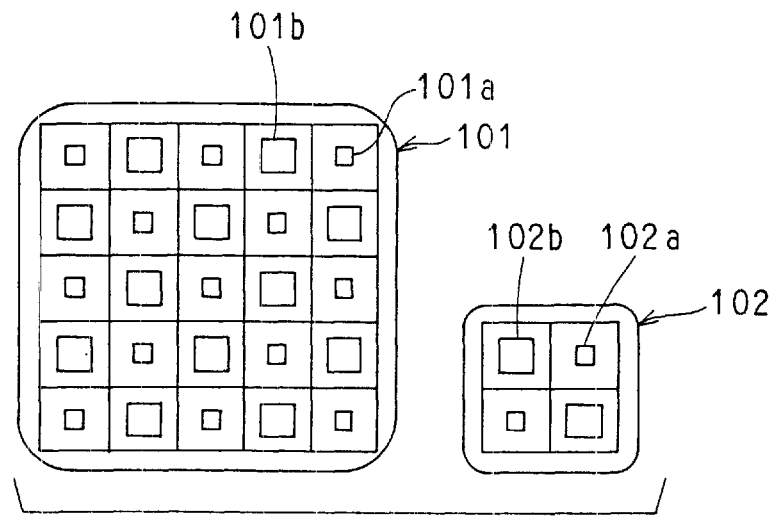
FIG. 5A is a plan view showing source cells and drain cells according to a prior art.
Figure 5B:
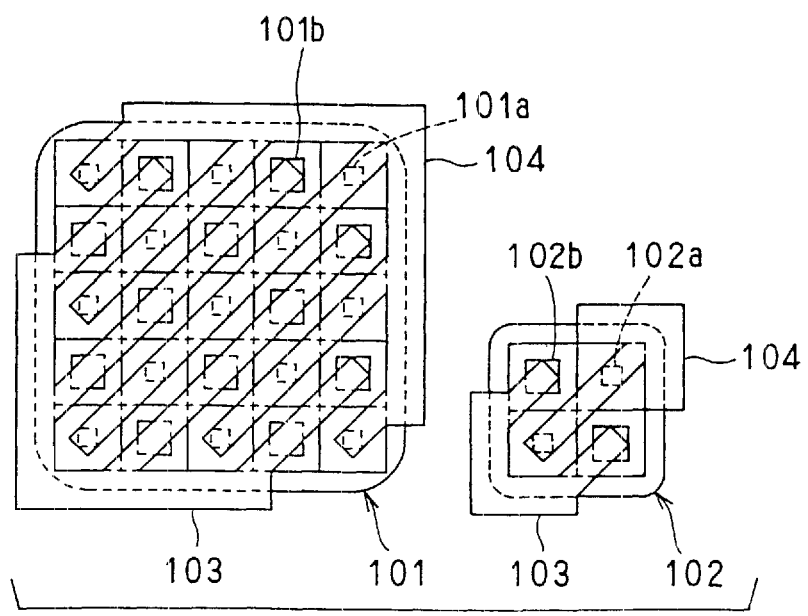
FIG. 5B is a plan view showing wiring members for the source cells and the drain cells shown in FIG. 5A.

Thus, the sense LDMOS device 4 is incorporated (included) in the main LDMOS device 3 in the present embodiment. In the conventional structure shown in FIG. 5B, the LDMOS transistors of the main Tr 101 are arranged to form a generally square shape, and the LDMOS transistors of the sense Tr 102 are arranged to form another square shape separately from the main Tr 101. As opposed to this, in the present embodiment, the LDMOS transistors constituting the main LDMOS device 3 and the sense LDMOS device 4 cooperatively form the generally square shape, and the LDMOS transistors constituting the sense LDMOS device 4 form the diagonal of the square shape so that the sense LDMOS device 4 is provided to contact all the four sides of the square shape. That is, the LDMOS transistors of the sense LDMOS device 4 are disposed on every side of the square shape, i.e., form a part of every side of the square shape.

In the semiconductor device having the above-described structure, because the LDMOS device 4 composed of the LDMOS transistors extends from the corner to pass through the center of the square shape, the variations in ON resistance of the LDMOS transistor disposed on the corner and the LDMOS transistor disposed on the center of the square shape are averaged, and taken out as a detection value.

Figure 4:
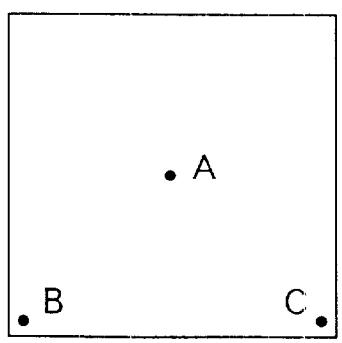
FIG. 4 is a schematic view for explaining variations in stress and the like on a substrate.

For example, in case where a generally square shape is formed by plural LDMOS transistors as shown in FIG. 4, variation factors of ON resistance of one LDMOS transistor, such as calorific value, heat release, current density of the LDMOS transistor, and a stress derived during packaging, change with positions, i.e., are shifted from one another at position A that is the center of the square shape, position B or C that is a corner of the square shape. Because of this, only when the LDMOS transistors of the sense LDMOS device 4 are incorporated locally at positions A, B or/and C in the main LDMOS device 3, the ON resistance of the sense LDMOS device 4 would largely depend on the variation factors at a specific position, and not involve the variation factors at a large area to be averaged.

As opposed to this, according to the present embodiment, because the LDMOS transistors of the sense LDMOS device 4 are arranged to pass through the generally square shape diagonally, each LDMOS transistor has ON resistance based on the variation factors at the respective position. That is, the sense LDMOS device 4 has ON resistance involving all of the variation factors at every position in the vertical and lateral directions of the square shape. It is considered synthetically that the ON resistance of the sense LDMOS device 4 can be set to be a value that is obtained by averaging the variation factors at every position in the vertical and lateral directions of the square shape. Therefore, the variations in ON resistance of the main LDMOS device 3 and the sense LDMOS device 4 can be suppressed, and the shift of the current mirror ratio can also be prevented. Accordingly, the load drive circuit controls the current at high accuracy.

In the above-described embodiment, the LDMOS transistors constituting the main LDMOS device 3 and the sense LDMOS device 4 are arranged to form a generally square shape; however, the shape is not limited to the square. For example, they may be arranged into a rectangular shape or a polygonal shape other than a rectangle so long as the LDMOS transistors of the sense LDMOS device are disposed at both a corner and a center of the rectangular shape or the polygonal shape. Accordingly, the same advantages as described above can be provided. The arrangement positions on which the LDMOS transistors are provided are not necessary to be exactly the corner and the center of the polygonal shape, but may be sufficient when the arrangement positions are approximate to the corner and the center thereof.

For example, when the LDMOS transistors are arranged to form a rectangular shape having a long side twice longer than a short side thereof, two wiring members may be provided for the sense LDMOS so that one of the wiring members extends diagonally to contact one of short sides and the other of the wiring members extends diagonally to contact the other of the short sides. Although the present invention is applied to the load drive circuit shown in FIG. 1 in the above-described embodiment, the semiconductor device according to the present invention may be applied to load drive circuit having other constitutions.

While the present invention has been shown and described with reference to the foregoing preferred embodiment, it will be apparent to those skilled in the art that changes in form and detail may be made therein without departing from the scope of the invention as defined in the appended claims.

What is claimed is:

1. A semiconductor device comprising:
   a substrate;
   a main MOS transistor formed on the substrate for supplying a current to a load, the main MOS transistor being composed of a first lateral type MOS transistor and forming a current path in a direction parallel to a surface of the substrate; and
   a sense MOS transistor formed on the substrate and connected to the main MOS transistor in parallel to form a current mirror circuit with the main MOS transistor for controlling the current supplied to the load, the sense MOS transistor being composed of a second lateral type MOS transistor and forming a current path in a direction parallel to the surface of the substrate, wherein:
   the sense MOS transistor and the main MOS transistor share a same region of the substrate and the sense MOS transistor forms a polygonal shape on a surface of the substrate in cooperation with the main MOS transistor;
   the sense MOS transistor extends to pass through a corner and a center of the polygonal shape; and
   the main MOS transistor and the sense MOS transistor have a plurality of drain cells and a plurality of source cells that are arranged in a mesh shape, a contour of which forms the polygonal shape on the substrate; and
   the sense MOS transistor includes first and second drain cells that are respectively arranged on the corner and the center of the polygonal shape, the first and the second drain cells being electrically connected to each other.

2. The semiconductor device according to claim 1, wherein:
   the main MOS transistor and the sense MOS transistor have a plurality of drain cells and a plurality of source cells that are arranged in a mesh shape, a contour of which forms the polygonal shape on the substrate; and
   the sense MOS transistor includes first and second drain cells that are respectively arranged on the corner and the center of the polygonal shape, the first and second drain cells being electrically connected to each other.

3. The semiconductor device according to claim 1, wherein the sense MOS transistor has a drain wiring member that connects the first and second drain cells and extends to pass through the corner and the center of the polygonal shape.

4. The semiconductor device according to claim 1, wherein the main MOS transistor and the sense MOS transistor have a common source wiring member having a comb-shape and electrically connecting the plurality of source cells of the main MOS transistor and the sense MOS transistor.

5. The semiconductor device according to claim 1, wherein the polygonal shape is a generally square shape.

6. The semiconductor device according to claim 1, wherein:
   the plurality of drain cells include a first plurality of drain cells of the sense MOS transistor, the first plurality of drain cells being arranged along a diagonal of the polygonal shape.

7. The semiconductor device according to claim 1, wherein:
   the plurality of drain cells includes a first plurality of drain cells of the sense MOS transistor, the first plurality of drain cells being arranged on every side of the polygonal shape.

8. The semiconductor device according to claim 1, wherein the substrate is an SOI substrate.

9. A semiconductor device comprising:
   a substrate;
   a main MOS transistor formed on the substrate for supplying a current to a load, the main MOS transistor having a first plurality of drain cells and a first plurality of source cells; and
   a sense MOS transistor formed on the substrate and connected to the main MOS transistor in parallel to form a current mirror circuit with the main MOS transistor for controlling the current supplied to the load, the sense MOS transistor having a second plurality of drain cells and a second plurality of source cells, wherein:
   the first plurality of drain cells, the first plurality of source cells, the second plurality of drain cells, and the second plurality of source cells are arranged on a surface of the substrate to form a polygonal shape as a whole;
   the second plurality of drain cells of the sense MOS transistor include drain cells respectively disposed on a corner and a center of the polygonal shape; and
   the first and second pluralities of drain cells and the first and second pluralities of source cells are arranged in a checkerboard pattern.

10. The semiconductor device according to claim 9, wherein the first and second pluralities of drain cells and the first and second pluralities of source cells are arranged alternately in first and second directions perpendicular to each other.

11. The semiconductor device according to claim 9, wherein the first and second pluralities of drain cells and the first and second pluralities of source cells are arranged at an identical pitch.

12. The semiconductor device according to claim 9, wherein the second plurality of drain cells are arranged to form a diagonal of the polygonal shape.

13. The semiconductor device according to claim 12, wherein the first plurality of drain cells are arranged at both sides of the second plurality of drain cells so that the sense MOS transistor and the main MOS transistor share the same region of the substrate.

14. The semiconductor device according to claim 9, wherein the semiconductor substrate is an SOI substrate.

15. A semiconductor device comprising:
   a gate layer for a common gate overlying a semiconductor substrate;
   a plurality of source cells and drain cells arrayed in a checkerboard pattern on a surface of the substrate, the gate layer having openings that provide the source cells and the drain cells with metal contacts respectively; and
   a plurality of metal contact lines extending at an oblique angle to the orthogonal pattern of the source and drain cells, the metal contact lines being generally parallel to each other, wherein the metal contact lines are classified into at least:
   a first drain electrode line that connects first parts of the drain cells;
   a source electrode line that connects the source cells, wherein the first drain electrode line and the source electrode line form a current path of a main transistor; and
   a second drain electrode line that connects seconds parts of the drain cells and is isolated from the first drain electrode line, wherein the second drain electrode line and the source electrode line form a current path of an auxiliary transistor.

16. A semiconductor device according to claim 15, wherein the auxiliary transistor is a sensing transistor for sensing a current flowing through the main transistor.

17. A semiconductor device according to claim 16, wherein the second parts of the drain cells are arranged along a diagonal or an array of the source and drain cells.

18. A semiconductor device according to claim 16, wherein the second parts of the drain cells are arranged in an array of the source and the drain cells to include a corner portion and a center portion of the array.

19. A semiconductor device according to claim 15, wherein the gate layer overlies a channel region defined between the drain cells and the source cells.

20. A semiconductor device according to claim 18, wherein the substrate is an SOI substrate.

* * * * *